(12) United States Patent
Lo et al.

(10) Patent No.: US 6,507,120 B2
(45) Date of Patent: Jan. 14, 2003

(54) FLIP CHIP TYPE QUAD FLAT NON-LEADED PACKAGE

(75) Inventors: Randy H. Y. Lo, Taichung Hsien (TW); Chi-Chuan Wu, Taichung (TW)

(73) Assignee: Siliconware Precision Industries Co., Ltd., Taichung Hsien (TW)

( * ) Notice: Subject to any disclaimer, the term of this patent is extended or adjusted under 35 U.S.C. 154(b) by 0 days.

(21) Appl. No.: 09/746,819

(22) Filed: Dec. 22, 2000

(65) Prior Publication Data
US 2002/0079592 A1 Jun. 27, 2002

(51) Int. Cl.⁷ .......................... H01L 23/48; H01L 23/28
(52) U.S. Cl. ................... 257/778; 257/673; 257/675; 257/796
(58) Field of Search .................. 257/778, 787, 257/712, 796, 673, 675, 676, 734–735, 737–738, 666–674; 438/108, 124, 126, 127

(56) References Cited

U.S. PATENT DOCUMENTS

| | | | | |
|---|---|---|---|---|
| 5,212,402 A | * | 5/1993 | Higgins, III | 257/532 |
| 5,450,283 A | * | 9/1995 | Lin et al. | |
| 5,663,593 A | * | 9/1997 | Mostafazadeh et al. | 257/666 |
| 5,731,631 A | * | 3/1998 | Yama et al. | |
| 5,849,608 A | * | 12/1998 | Abe | |
| 5,969,947 A | * | 10/1999 | Johnson et al. | 361/704 |

* cited by examiner

Primary Examiner—Olik Chaudhuri
Assistant Examiner—DiLinh Nguyen
(74) Attorney, Agent, or Firm—J.C. Patents

(57) ABSTRACT

A flip chip type quad flat non-leaded package, comprising: a plurality of leads each having a first surface and a second surface opposite to the first surface; a die having an active surface and a backside opposite the active surface, wherein the active surface has a plurality of bonding pads, each having a bump, and wherein each bump is connected to a first surface of one of the leads respectively; and a molding compound encapsulating the leads and the die, exposing second surfaces of the leads.

21 Claims, 6 Drawing Sheets

FLIP CHIP TYPE QUAD FLAT NON-LEADED PACKAGE

BACKGROUND OF THE INVENTION

1. Field of the Invention

The present invention relates to a structure of a quad flat non-leaded package. More particularly, the present invention relates to a quad flat non-leaded package using flip chip technology.

2. Description of the Related Art

In the current integrated circuit device, features such as high integrity, high density, compact size and multifunction are required more and more seriously. They are also needed in the development of the semiconductor manufacturing process and subsequent package process. For the semiconductor manufacture process, a semiconductor device having the line width of 0.18 micrometer has been put into mass production. The system on chip (SOC) also has been developed in sequence. Many high-density package structures, such as chip scale package (CSP), and multi chip module (MCM) have been manufactured in a corresponding way.

A quad flat non-leaded package (QFN) developed by Matsusita company is a common leadframe based CSP using a leadframe as a package carrier. A leadless CSP has advantages such as short signal transmitting trace and reduced signal loss, which has been used as a common package structure for a low pin count semiconductor device.

Referring to FIG. 1, a cross sectional view of a quad flat non-leaded package in the prior art is shown. A leadframe of a conventional quad flat non-leaded package 100 consists of a die pad 102 and a plurality of leads 104 arranged along the periphery thereof The back surface 108b of a die 108 is attached to the top surface 102a of the die pad 102 by the silver paste 106. A bonding pad 114 on the active surface 108a of the die 108 is electrically connected to the top surfaces 104a of the leads 104 by gold wires. The die 108, the gold wires 110, the top surface 102a of the die pad 102, the top surfaces 104a of the leads are encapsulated with molding compound, exposing the bottom surface 102b of the die pad 102 and the bottom surfaces 104b of the leads 104. The package is connected to a printed circuit board (not shown) outside by the bottom surfaces 104b of the leads 104.

The connection of bonding pads and leads in a conventional quad flat non-leaded package is achieved by gold wires. It is necessary to arrange the leads in the periphery of a die to keep an appropriate distance of about 15–30 mil so as to enlarge the area of the package. It needs to keep a certain distance from the top ends of the gold wires when encapsulating the gold wires, resulting in increased thickness of the package. Meanwhile, the signal transmission path becomes longer because of the connection made by the gold wires, resulting in reduced signal transmitting performance in the package, and signal delay and decay.

SUMMARY OF THE INVENTION

It is an object of the present invention to provide a flip chip type quad flat non-leaded package which can reduce the area and the thickness of the package and increase the density of the package.

It is another object of the present invention to provide a flip chip type quad flat non-leaded package which can improve the heat dissipating effect for the package and the quality of the product.

In order to achieve the above and other purposes of the present invention, a flip chip type quad flat non-leaded package for this invention is disclosed. A plurality of leads, each having a first surface and a second surface opposite to the first surface; a die having an active surface and a backside opposite the active surface, wherein the active surface has a plurality of bonding pads, each having a bump, and wherein each bump is connected to the first surface of one of the leads respectively; and a molding compound encapsulating the leads and the die, exposing the second surfaces of the leads.

According to one perferred embodiment of the present invention, the molding compound optionally exposes the backside of the die. Also, a heatsink is optionally provided on the backside of the die to improve the heat dissipating performance. Further, a heatsink can be further provided on the active surface of the die to expose one surface thereof so as to improve the heat dissipating performance of the product as well.

Since the connection of the die and the leads in package according to the present invention is achieved by flip chip technology using even only a bump, the leads can be directly superimposed on the bonding pads of the die without any die pad. Therefore, the area and the thickness of the package are reduced. Furthermore, the die is connected to the leads by conductive bumps, resulting in shortened path for signal transmission and improved electric property of the package. A heatsink can be further provided on the backside or the active surface of the die to improve the heat dissipating effect and increase the quality of the product.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principle of the invention. In the drawings.

DESCRIPTION OF THE PREFERRED EMBODIMENTS

Figure 1:
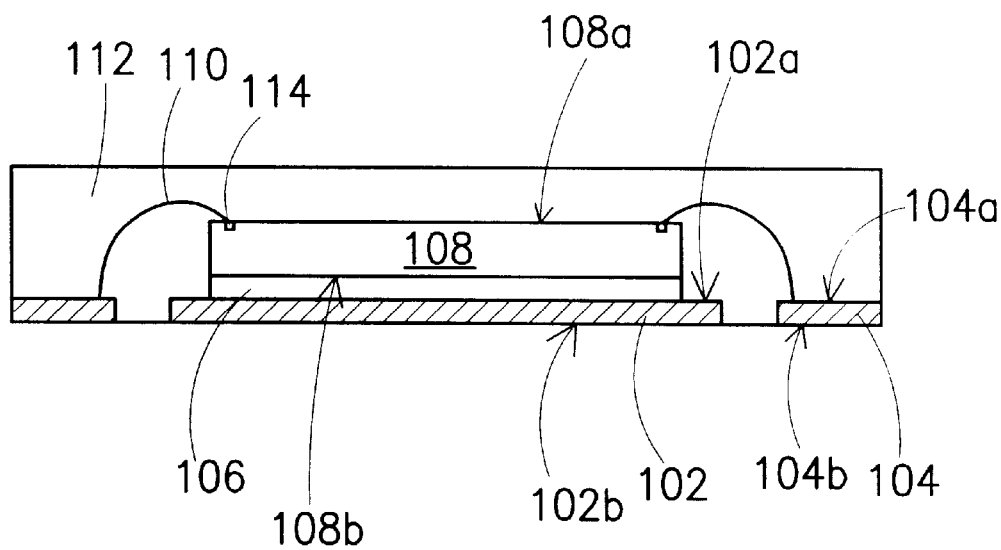
FIG. 1 is a cross sectional view of a conventional quad flat non-leaded package in the prior art.
Figure 2:
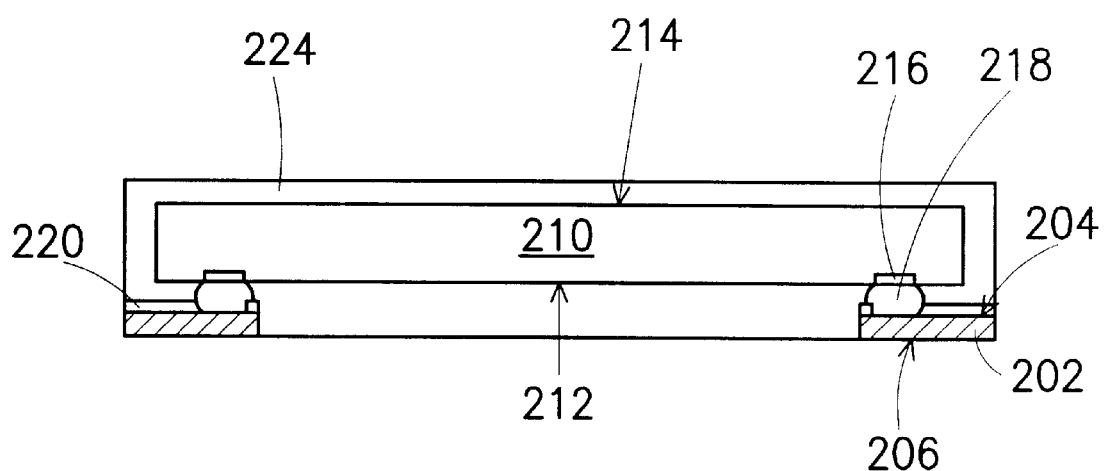
FIG. 2 is a cross sectional view of a flip chip type quad flat non-leaded package according to a first preferred example of the present invention.
Figure 3:
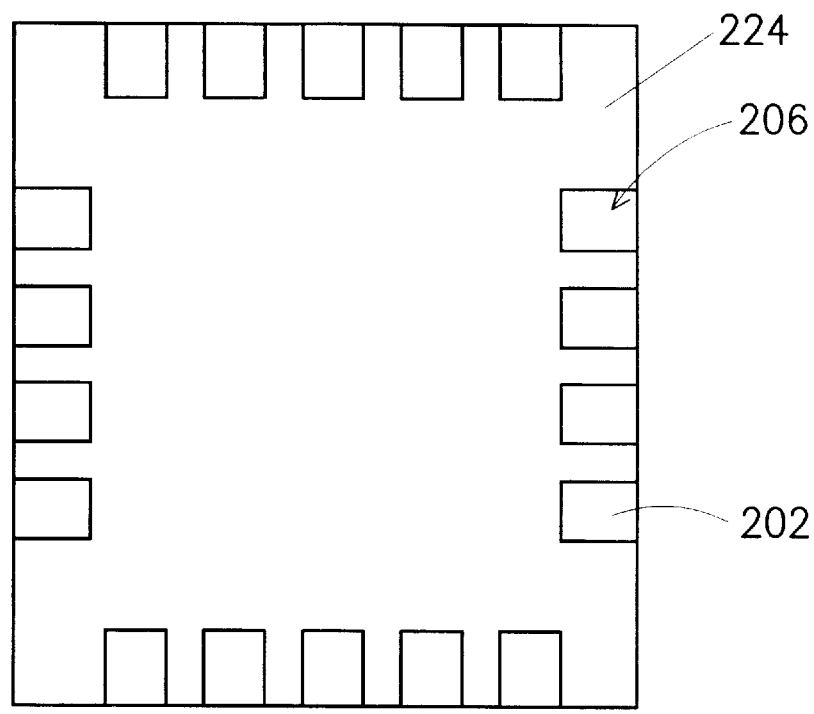
FIG. 3 is a bottom view of FIG. 2.
Figure 4:
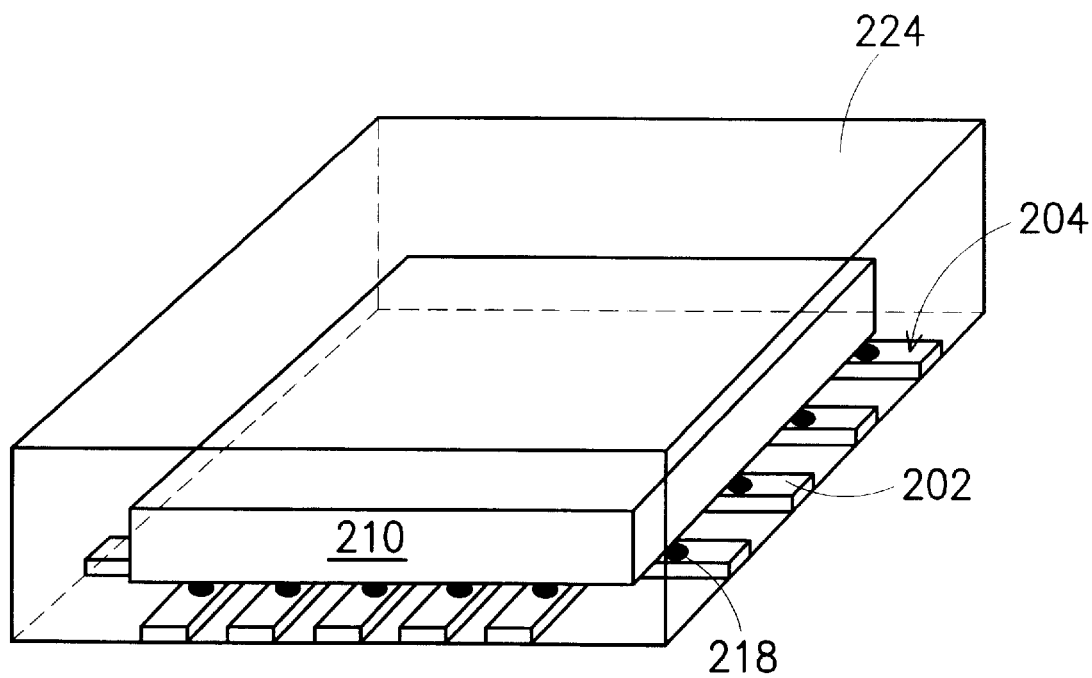
FIG. 4 is a perspective view of FIG. 2.

Referring to FIGS. 2, 3 and 4, in which FIG. 2 is a schematic, cross-section view of a flip chip type quad flat non-leaded package according to the present invention; FIG. 3 is a bottom view of FIG. 2, and FIG. 4 is a perspective view of FIG. 2.

A lead frame type carrier constructed from a plurality of leads 202 is used in the flip chip type quad flat non-leaded package 200 of the present invention. Each of the leads 202 has a first surface 204 (top surface) and a second surface 206 (bottom surface) opposite to the first surface 204. A die 210 has an active surface 212 and a backside 214 opposite the active surface 212. The active surface 212 has a plurality of bonding pads 216 on which bumps 218 are formed respectively. The forming of bumps 218 further includes formation of under bump metals (UBM) and formation of bumps, which are well known in the art. The material for the bumps 218 includes tin/lead alloy, gold, conductive polymer and so on. The die is arranged such that the active surface 212 faces the leads 202 and each bump 218 corresponds to the first surface 204 of the lead 202. The die is electrically connected to the leads 202 by the bump 218. The molding compound 224 encapsulates the die 210 and the first surface 204 of the leads 202, exposing the second surface 206 of the leads 202 and the side thereof as external junction for the package. The material for the molding compound 224 is epoxy, for example.

Figure 5:
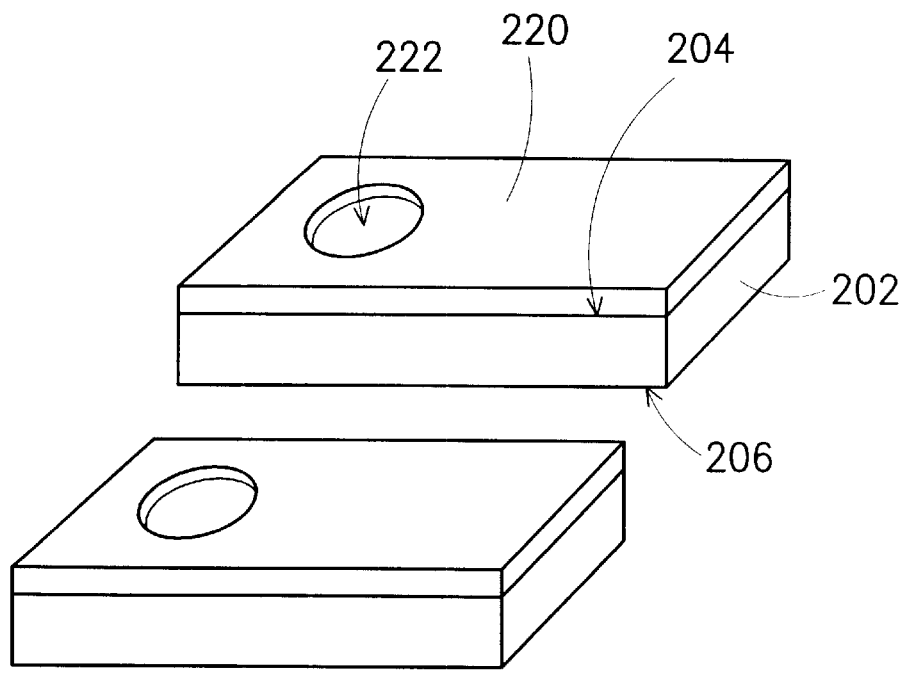
FIG. 5 is a local enlarged view of leads 202 in FIG. 2.

However, in order to ensure the yield of the flip chip process, it is preferred that the first surface 204 of leads 202 is covered by solder resistance. Referring to FIG. 5, a locally enlarged perspective view of leads 202 in FIG. 2 is shown. Preferably, solder resistance process is carried out to form a solder mask or solder resistor on the first surface 204 of leads 202. The material for the solder mask includes insulating material, such as UV photosensitve solder mask and thermoset solder mask. The method of forming the solder mask includes roller coating, curtain coating, screen printing, dipping and dry film forming. Then, the solder mask 220 is defined to form an opening 222 at the position where the bumps are attached. With limited wetting range for bump by forming the opening 222, the attachment can be ensured in the sequential flip chip process.

In one embodiment of the present invention, the diameter of the tin/lead alloy is ranged from about 100 to 200 micrometer, and that of a gold bump about 25 micrometer. Compared with the conventional attachment structure used in wire bonding, the length of the gold wire of the present invention is in the range of 500 to 3000 micrometer. Therefore, in the flip chip type quad flat non-leaded package of the present invention, the signal transmission path can be shortened and the electric property of the package can be improved greatly. Furthermore, the area and thickness of the package also can be reduced and the density of the package can be thus increased by the flip chip technology. Further, with regard to tin/lead bump, it can be formed by plating or screen printing which applies the solder paste (tin/lead paste) on a surface of a corresponding under bump metal (UBM) layer, then performing a reflow process.

However, variations of the package according to the present invention can be made to enhance the heat dissipating effect.

Figure 6:
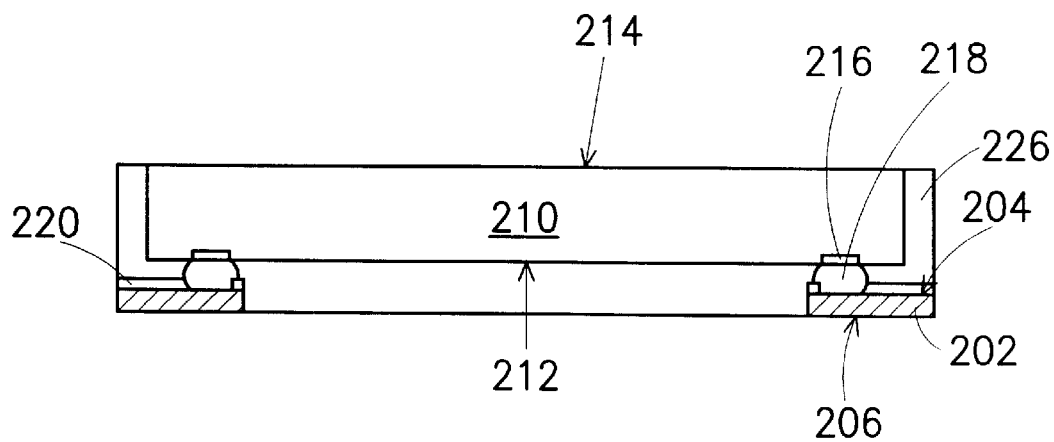
FIG. 6 is a cross sectional view of a flip chip non-leaded package according to a second preferred example of the present invention.

See FIG. 6, a schematic, cross-sectional view of a flip chip type quad flat non-leaded package according to a second preferred example of the present invention is shown. The second example is performed in the same way as the first example, except that the backside 214 of the die 210 is exposed after encapsulated with molding compound 226 such that the heat generated from the die 210 can be dissipated out of the package.

Figure 7:
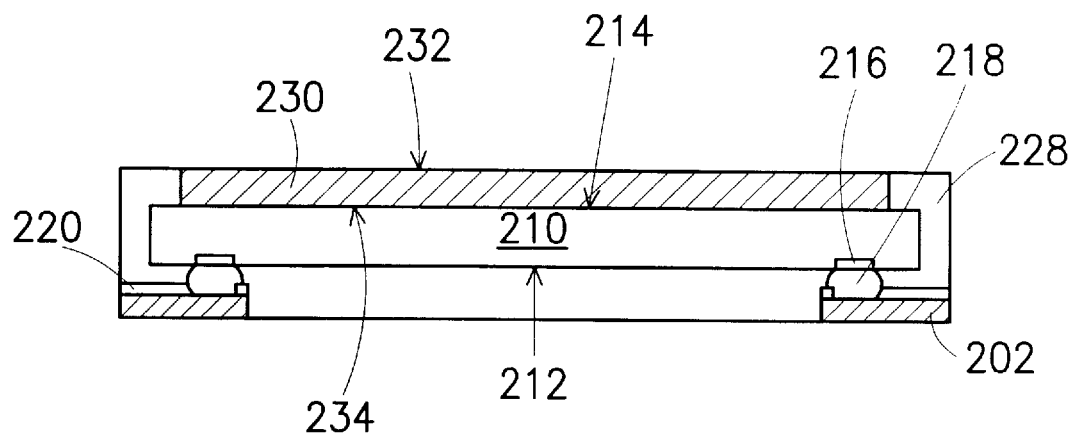
FIG. 7 is a cross sectional view of a flip chip non-leaded package according to a third preferred example of the present invention.

Referring to FIG. 7, a schematic, cross-sectional view of a flip chip type quad flat non-leaded package according to a third preferred example of the present invention is shown. A heatsink 230 having a top surface 232 and a bottom surface 234 corresponding thereto is further provided on the backside 214 of the die 210. The heatsink 230 is arranged such that the bottom surface 234 thereof faces the backside 214 of the die 210. The heatsink 230 can be connected to the die 210 directly or separated from each other at a constant distance. A mold material 228 is applied, exposing the top surface 232 of the heatsink 230. The heat generated can be dissipated out of the die 210 by heatsink 230.

Figure 8:
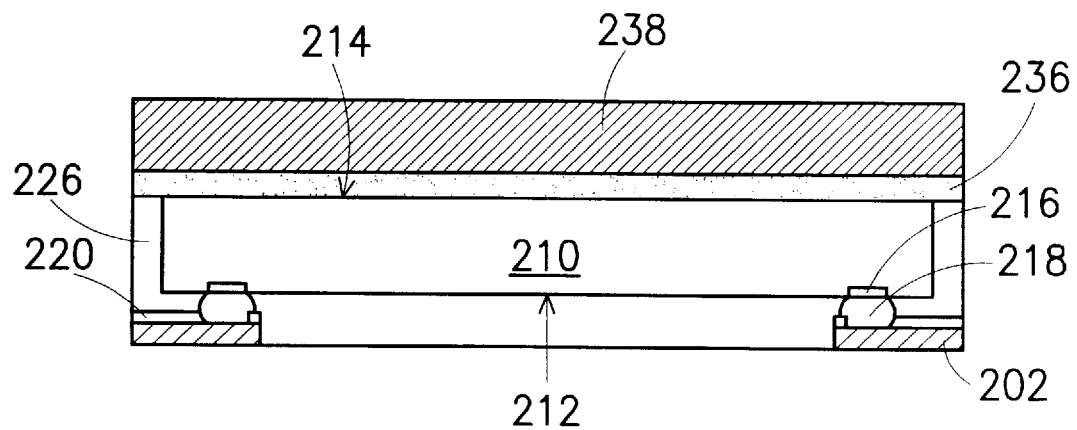
FIG. 8 is a cross sectional view of a flip chip non-leaded package according to a fourth preferred example of the present invention.

Referring to FIG. 8, a schematic, cross-sectional view of a flip chip type quad flat non-leaded package according to a fourth preferred example of the present invention is shown. In this example, it is similar to the second example, except that a heatsink 238 is optionally provided on the exposed backside of the die 210 and the heatsink 238 is fixed on the backside 214 of the die 210 by a thermal conductive material 236. The effect of heat dissipating for the package can be thus increased.

Figure 9:
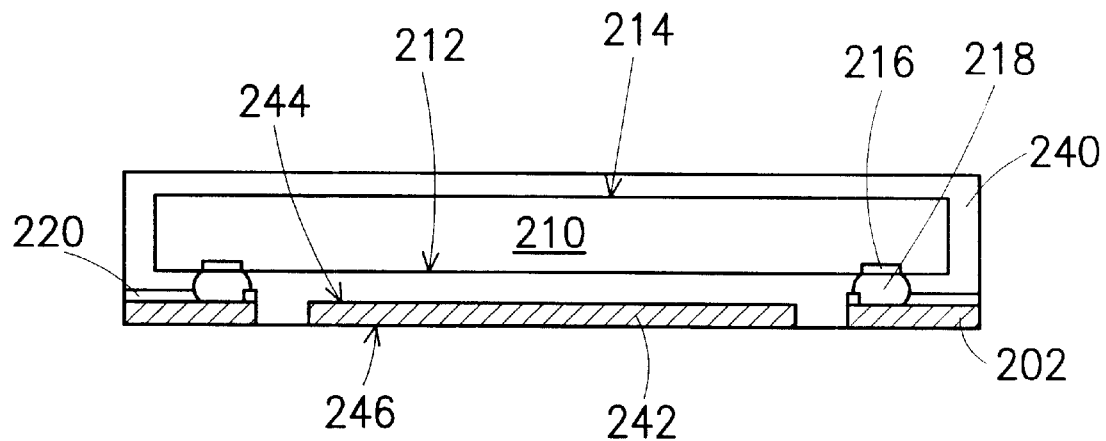
FIG. 9 is a cross sectional view of a flip chip non-leaded package according to a fifth preferred example of the present invention.

Referring to FIG. 9, a schematic, cross-sectional view of a flip chip type quad flat non-leaded package according to a fifth preferred example of the present invention is shown. This example is a combination of the above second, third and fourth examples. A heatsink can be, addition to provided on the backside of the die in the above example, optionally provided on the side of the active surface of the die. As shown in FIG. 9, a heatsink 242 having a top surface 244 and a bottom surface 246 opposite to the top surface 244 is provided on the side of the active surface 212 of the die 210. The heatsink 242 is arranged between the leads 202, i.e. the leads 202 are located at the boundary of the heatsink 242. The bottom surface 246 of the heatsink 242 is exposed after encapsulating with a molding compound 240, such that the heat generated can be dissipated out of the die 210 by the heatsink 242. In the subsequential assembly, the heatsink can be connected to the PCB by the bottom surface 246 thereof while the leads 202 are connected to the PCB by the surface mount technology (SMT).

Figure 10:
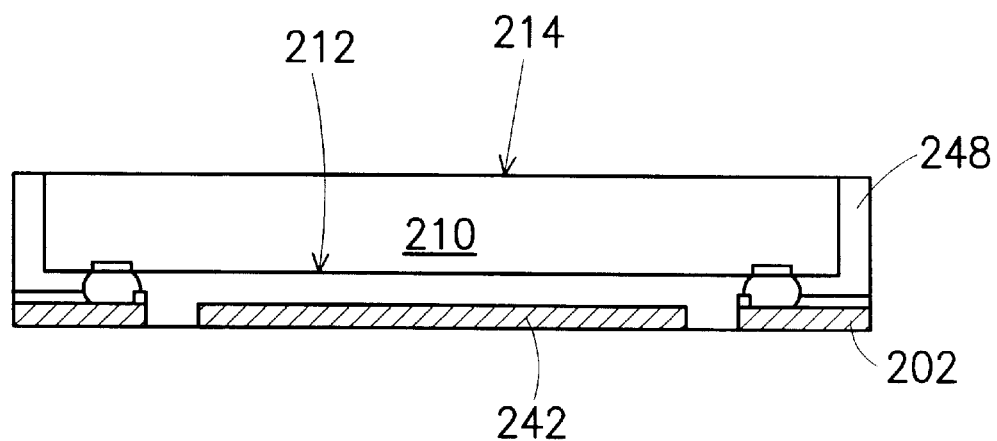
FIG. 10 is a cross sectional view of a flip chip non-leaded package according to a fifth preferred example of the present invention.

Referring to FIG. 10, a schematic, cross-sectional view of a flip chip type quad flat non-leaded package according to a sixth preferred example of the present invention is shown. This example is a combination of the above fifth and second example. In this example, the backside 214 of the die 210 is exposed after encapsulated with a molding compound 248.

Figure 11:
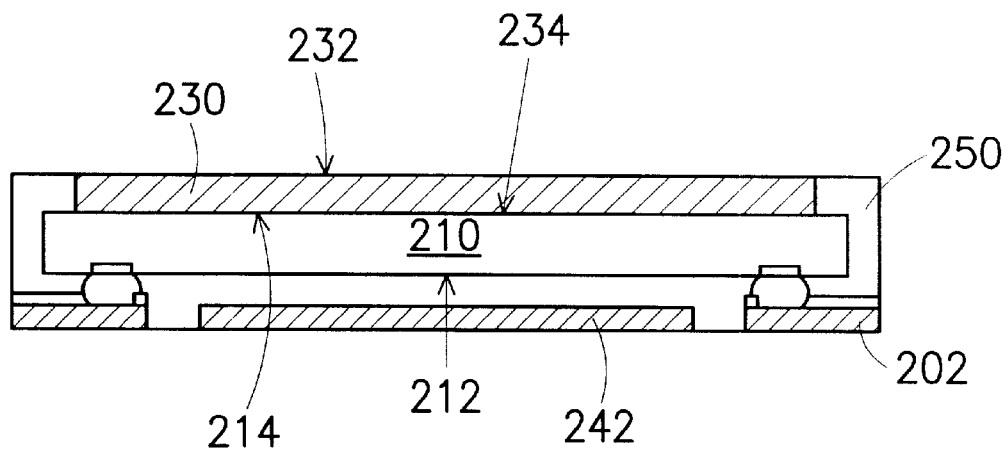
FIG. 11 is a cross sectional view of a flip chip non-leaded package according to a seventh preferred example of the present invention.

Referring to FIG. 11, a schematic, cross-sectional view of a flip chip type quad flat non-leaded package according to a seventh preferred example of the present invention is shown. This example is the combination of the fifth example and the third example. A heatsink 230 having a top surface 232 and a bottom surface 234 opposite to the top surface 232 is provided on the backside 214 of the die 210. The heatsink 230 is arranged such that the bottom 234 thereof faces the backside 214 of the die 210. The heatsink 230 can be connected to the die 210 directly or separated from each other at a constant distance. A mold material 228 is applied, exposing the top surface 232 of the heatsink 230.

Figure 12:
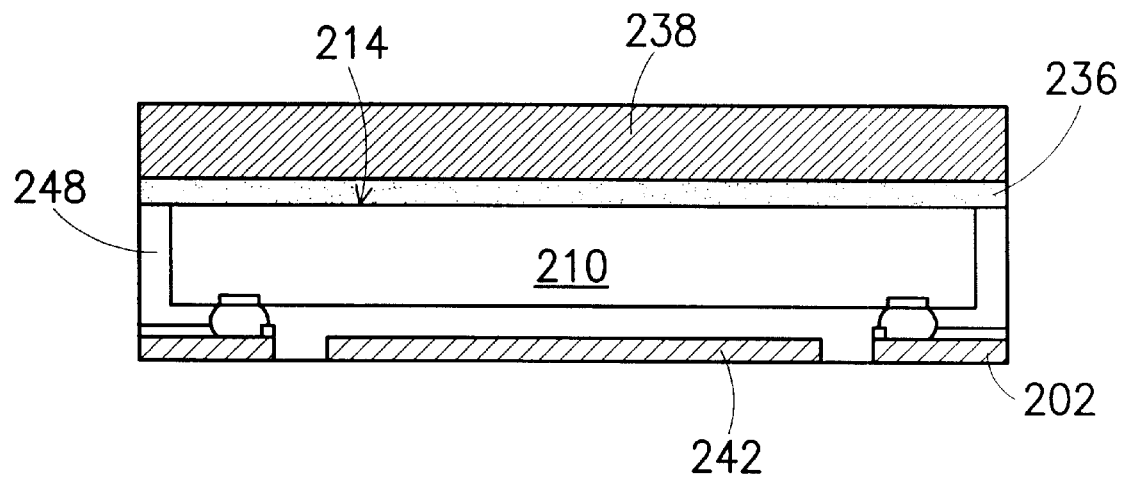
FIG. 12 is a cross sectional view of a flip chip non-leaded package according to a eighth preferred example of the present invention.

Referring to FIG. 12, a schematic, cross-sectional view of a flip chip type quad flat non-leaded package according to a eighth preferred example of the present invention is shown. This example is a combination of the above sixth example and fourth example. The backside 214 of the die 210 is connected to a heatsink 238. The heatsink 238 is fixed to the backside 214 of the die 210 by a thermally conductive material 236.

In view of the foregoing, the package of the present invention provides at least the advantages:

1. The connection of the die to the leads is achieved by flip chip technology using bumps. The leads match the bonding pads of the die without providing any die pad for the carrier. The area and the thickness of the package are thus reduced and the density thereof is increased.

2. Further, the die is electrically connected to the leads by conductive bumps. The signal transmission path can be shortened to prevent the signal from being lost and delayed. The electric property of the package can be improved and the signal transmission performance thereof is enhanced.

3. The backside of the die can be exposed. A heatsink can be optionally provided on either the backside or the active surface of the die to improve the effect of heat dissipating and the quality of the product.

It will be apparent to those skilled in the art that various modifications and variations can be made to the structure of the present invention without departing from the scope or spirit of the invention. In view of the forgoing, it is intended that the present invention cover modifications and variations of this invention provided they fall within the scope of the following claims and their equivalents.

What is claimed is:

1. A flip chip type quad flat non-leaded package comprising:
   a plurality of leads, each having a first surface and a second surface opposite to the first surface;
   a die having an active surface and a backside opposite the active surface, wherein the active surface has a plurality of bonding pads each of which are attached to a bump, and wherein each bump is connected to a first surface of one of the leads respectively; and
   a molding compound encapsulating the leads and the die, wherein the entire second surfaces of the leads are externally exposed by the molding compound, while the leads are not extended out of the molding compound.

2. The flip chip type quad flat non-leaded package of claim 1, wherein the leads are arranged in the form of square.

3. The flip chip type quad flat non-leaded package of claim 1, wherein the fist surface of the lead has a solder mask which has an opening connected to the bumps.

4. The flip chip type quad flat non-leaded package of claim 1, wherein the bump is tin/lead bump.

5. The flip chip type quad flat non-leaded package of claim 4, wherein the tin lead bump is formed by plating and reflowing.

6. The flip chip type quad flat non-leaded package of claim 4, wherein the tin lead bump is formed by screen printing and reflowing.

7. The flip chip type quad flat non-leaded package of claim 1, wherein the bump is gold bump.

8. The flip chip type quad flat non-leaded package of claim 7, wherein the gold bump is formed by bonding on each bonding pad using a wire bonding device.

9. The flip chip type quad flat non-leaded package of claim 1, wherein the backside of the die can be exposed after encapsulating.

10. The flip chip type quad flat non-leaded package of claim 9, wherein a heatsink is further provided on the backside of the die, and the heatsink is connected to the backside of the die by a thermal conductive material.

11. The flip chip type quad flat non-leaded package of claim 1, wherein the molding compound is epoxy resin.

12. The flip chip type quad flat non-leaded package of claim 1, wherein a heatsink having a bottom surface and top surface opposite the bottom surface is further provided on the backside of the die such that the top surface of the heatsink is exposed after encapsulating the molding compound.

13. A flip chip type quad flat non-leaded package comprising:
    a first heatsink having a first top surface and a first bottom surface opposite the first top surface;
    a plurality of leads arranged in the periphery of the first heatsink, each lead having a first surface and a second surface opposite to the first surface;
    a die having an active surface and a backside opposite the active surface, wherein the active surface has a plurality of bonding pads each of which are attached to a bump, and wherein each bump is connected to the first surface of one of the leads respectively; and
    a molding compound encapsulating the leads, the first heatsink and the die, wherein entirely the second surfaces of the leads are externally exposed by the molding compound for directly external connection, the first bottom surfaces of the heatsink are externally exposed as well, and the leads are not extended out of the molding compound.

14. The flip chip type quad flat non-leaded package of claim 13, wherein the fist surface of the lead has a solder mask which has an opening connected to the bumps.

15. The flip chip type quad flat non-leaded package of claim 13, wherein the bump is tin/lead bump.

16. The flip chip type quad flat non-leaded package of claim 13, wherein the bump is gold bump.

17. The flip chip type quad flat non-leaded package of claim 13, wherein the backside of the die is exposed after encapsulating.

18. The flip chip type quad flat non-leaded package of claim 17, wherein a second heatsink is provided on the backside of the die, and the second heatsink is connected to the backside of the die by a thermal conductive material.

19. The flip chip type quad flat non-leaded package of claim 13, wherein the molding compound is epoxy resin.

20. The flip chip type quad flat non-leaded package of claim 13, wherein a second heatsink having a bottom surface and a top surface opposite the bottom surface is provided on the backside of the die such that the top surface of the second heatsink is exposed after encapsulating.

21. A flip chip type quad flat non-leaded package comprising:
    a plurality of leads made of a single layer, each having a first surface and a second surface opposite to the first surface;
    a die having an active surface and a backside opposite the active surface, wherein the active surface has a plurality of bonding pads each of which are attached to a bump, and wherein each bump is connected to a first surface of one of the leads respectively; and
    a molding compound encapsulating the leads and the die, wherein the entire second surfaces of the leads are externally exposed by the molding compound, while the leads are not extended out of the molding compound.

* * * * *